U.S. Patent Number: 5,170,297

United States Patent [19]
Wahler et al.

[11] Patent Number: 5,170,297
[45] Date of Patent: Dec. 8, 1992

[54] CURRENT AVERAGING DATA SEPARATOR

[75] Inventors: Richard Wahler, Ronkonkoma; Carl Schooley; Robert Gross, both of Setauket, all of N.Y.

[73] Assignee: Standard Microsystems Corporation, Hauppauge, N.Y.

[21] Appl. No.: 553,735

[22] Filed: Jul. 13, 1990

[51] Int. Cl.[5] .................. G11B 5/09; H03K 5/00; H03K 5/13; H03D 3/24
[52] U.S. Cl. ............................. 360/51; 307/262; 328/155; 375/119
[58] Field of Search ............ 360/51, 45, 26, 36.1, 360/36.2; 375/119, 120, 118; 307/511, 262; 328/155; 331/17, 25

[56] References Cited
U.S. PATENT DOCUMENTS
4,837,643 6/1989 Tierney, III ............ 360/51

Primary Examiner—Aristotelis Psitos
Assistant Examiner—Won Tae C. Kim
Attorney, Agent, or Firm—Hopgood, Calimafde, Kalil, Blaustein & Judlowe

[57] ABSTRACT

A data separator for use in synchronizing data derived from a floppy disk or similar data source provides a variable net gain or loss of charge to vary the frequency of a voltage-controlled oscillator in accordance with the relative position of the data with respect to the clock until data centering or synchronization is achieved. The net charge is derived from a charge pump circuit that is controlled by a charge pump-up signal whose duration is proportional to the detected phase difference between the data and the clock, and a charge pump-down signal whose duration is one clock cycle. When the data pulse is centered within a clock cycle, the duration of a pump-up signal is one half that of a pump-down signal.

5 Claims, 7 Drawing Sheets

CURRENT AVERAGING DATA SEPARATOR

BACKGROUND OF THE INVENTION

1. Field of the Invention

The present invention relates to an improved data separator for use with magnetic or optical data storage devices such as a hard disk, floppy disk, or the like.

2. Prior Art

Digital data is commonly stored for subsequent processing in a microprocessor or other form of data processor in a variety of magnetic or optical data storage devices. One of the more commonly used medium for data storage is a floppy disk on which data is typically stored in one of several formats, such as self-clocking Manchester codes that include MFM, FM, and others. The data stored on a floppy disk in any one of these formats includes both data and clock pulses combined in an encoded data stream. In order for the data from the floppy disk to be useful in the data processor, the data must be separated from the clock, and encoded data pulses from the disk must be synchronized with respect to a half-bit clock or window.

U.S. Pat. No. 4,845,575, assigned to the assignee of this application, discloses a floppy disk data separator that employs a digital delay line to achieve the desired data and clock synchronization. That data separator has proven to be highly effective at current, relatively low data rates of up to 500 mHz to 1 mHz. However, at higher data rates, which are now coming into use, of between 1.0 mHz and 2.5 mHz, the required reduced quantization error makes it unfeasible to employ a digital delay line, which cannot provide the needed accuracy. The needed higher accuracy can be achieved by the use of an analog delay line but the high cost of an analog delay line that is capable of providing the requisite high precision at the higher data rates makes that an impractical design choice. There thus exists the need for a data separator capable of achieving accurate and reliable data separation that can be utilized at higher data rates at a lower cost and with less space required in an integrated circuit or circuit board.

It is accordingly an object of the present invention to provide a data separator capable of reliable operation at high frequencies.

It is another object of the invention to provide a data separator that does not require the use of a digital or analog delay line.

It is a further object of the invention to provide a data separator capable of operating at high frequencies and which is still relatively low in cost.

It is yet a further object of the invention to provide a data separator which operates with the precision of a data separator that employs an analog delay line but at a much lower cost and of a reduced size.

SUMMARY OF THE INVENTION

In the data separator of the present invention a variable net current or charge is added to or subtracted for each received data pulse in accordance with the relative position of the data pulse with respect to the clock pulse or window. The net gain or loss of charge determines the extent and direction of compensation of the frequency of the voltage-controlled oscillator needed to center the data pulse with respect to the clock cycle.

In one preferred embodiment of the invention, as described herein, the position of the data pulse within a clock cycle is detected to produce a pump-up signal having a duration less than or equal to one clock cycle in accordance with the deviation of the data from the center of the clock cycle. The occurrence of a pump-up signal following a data signal produces a pump-down signal, the latter having a duration of one clock cycle. When the data pulse is centered within a clock cycle, the duration of a pump-up signal is one-half that of a pump-down signal.

The pump-up and pump-down signals control the operation of a charge pump circuit, which produces current during a pump-up period at twice the rate as it does during a pump-down period. The net gain or loss of charge supplied by the charge pump during the pump-up and pump-down periods determines the compensation made to the voltage-controlled oscillator frequency. For a steady-state condition, at which the data pulse is centered in a clock cycle, a net charge of zero is supplied so that the voltage-controlled oscillator produces a constant frequency so long as data pulse centering is maintained. Since no comparison is made to determine which edge clock or data is first in time, the comparator need not be armed before a comparison is made and the data need not be delayed.

The data separator of the invention has two modes of operation, which are referred to as "Lock to Clock" and "Lock to Data". The Lock to Clock mode is used when the data separator is not attempting to read data from the disk drive. In this mode, the digital phase detector operates as a true phase/frequency discriminator capable of allowing a theoretically infinite capture range for the phase locked-loop (PLL). The capture range is limited only by the design constraints placed on the frequency excursion of the voltage-controller oscillator (VCO) included in the phase-locked loop. This extended lock capability while the PLL is locked to a constant reference clock guarantees proper lock recovery from any mislock which may occur during a read operation.

When the data separator attempts to lock to data being read from the disk drive it switches to the Lock to Data mode, in which the data separator acts as a current averaging data separator.

BRIEF DESCRIPTION OF THE DRAWINGS

To the accomplishment of the above and such further objects as may hereinafter appear, the present invention relates to a data separator as defined in the appended claims and as described in the following specification considered together with the accompanying drawings in which:

FIGS. 7(a)–(i) illustrates waveforms of signals used is the operation of the window and data generator of FIG. 6.

DETAILED DESCRIPTION OF THE INVENTION

Figure 1:
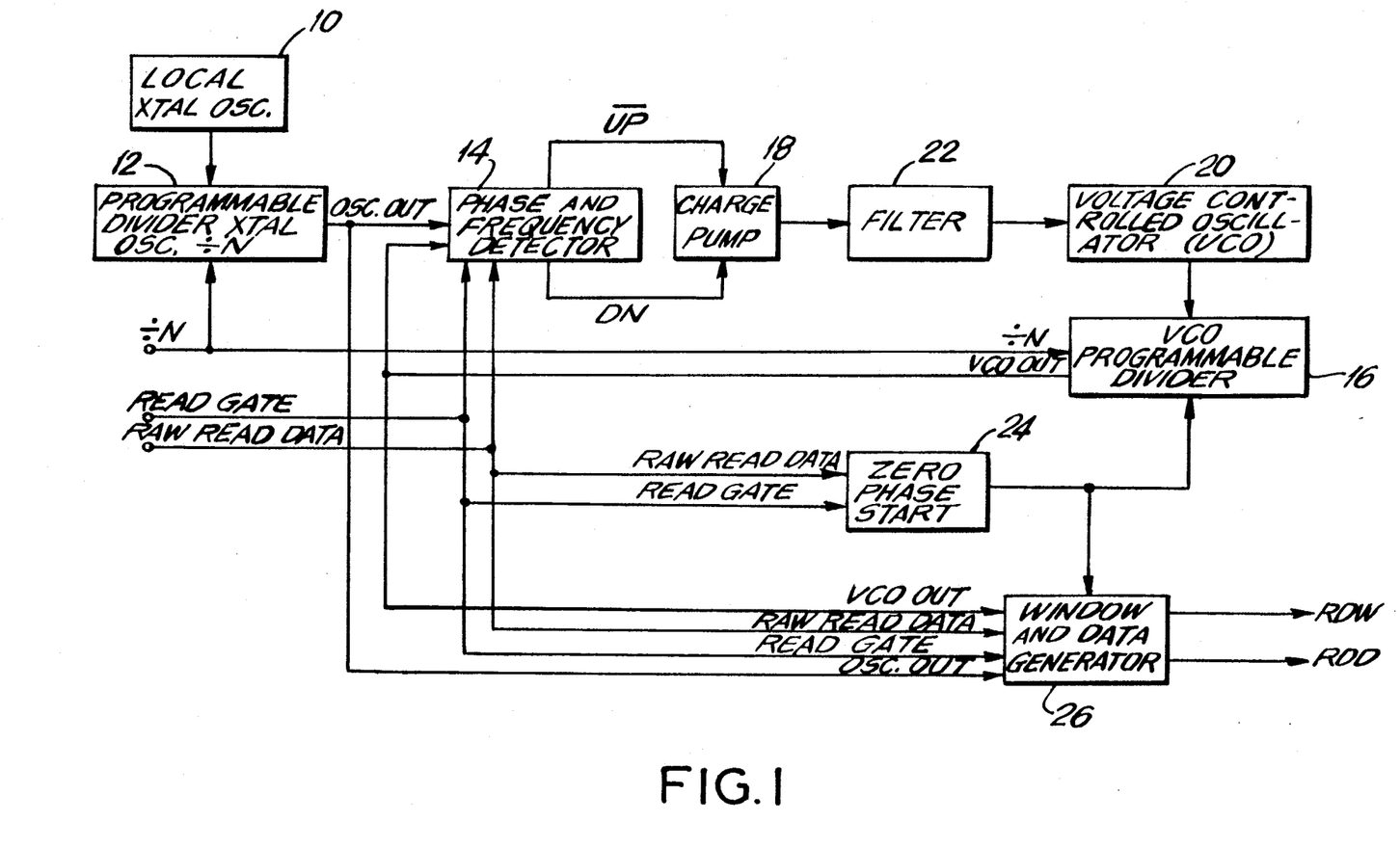
FIG. 1 is a schematic block diagram of a data separator in accordance with an embodiment of the invention.

The data separator of the invention, as in the preferred embodiment illustrated schematically in FIG. 1, includes an accurate asynchronous frequency source shown in the form of a local crystal oscillator 10. The output of oscillator 10, whose frequency is a known multiple of the data rate, is applied to the input of a programmable crystal oscillator divider 12, which divides the local crystal oscillator frequency by a factor of N to provide an output at a frequency of twice the data rate.

Figure 2:
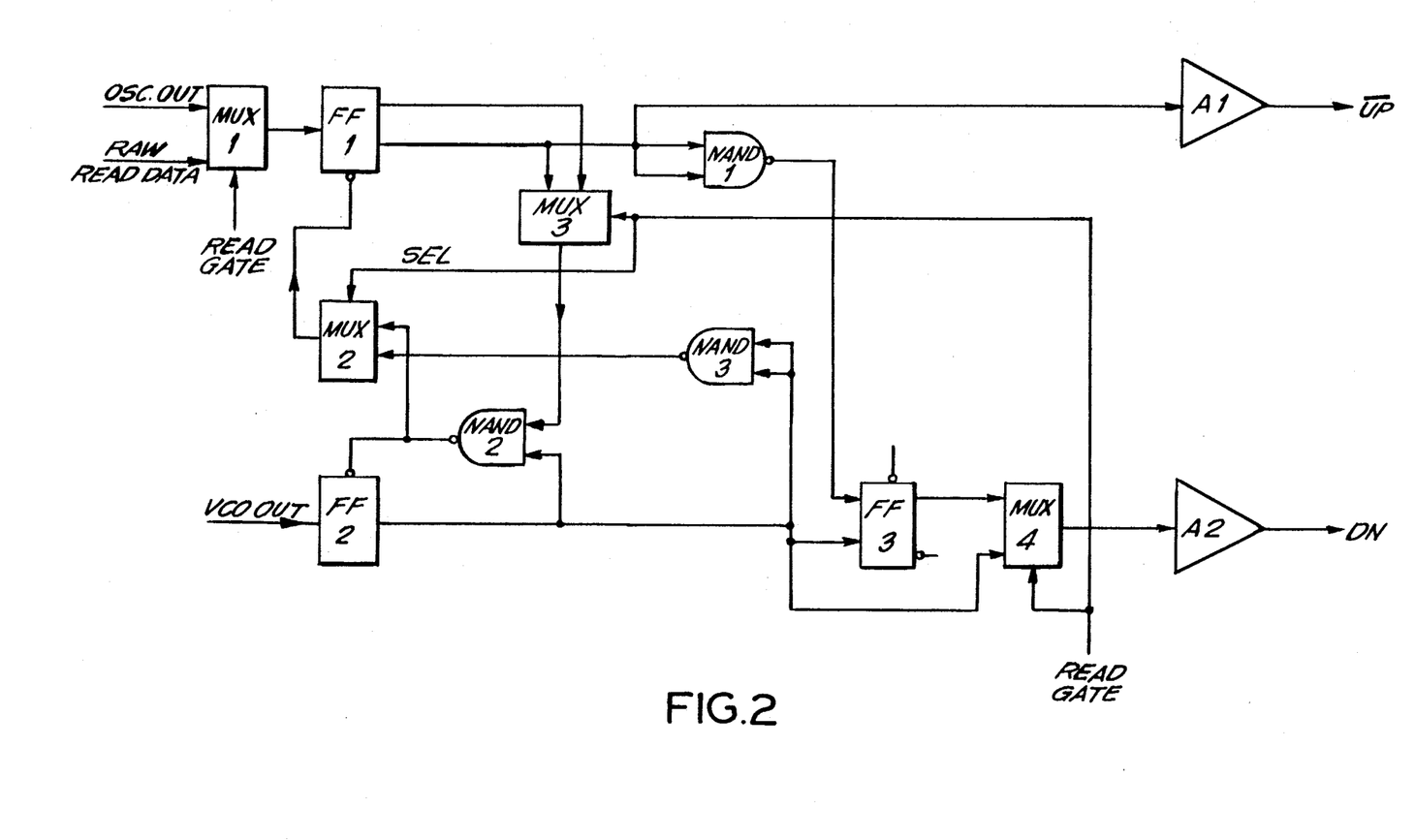
FIG. 2 is a more detailed schematic diagram of the phase detector of the data separator of FIG. 1.

The output of oscillator divider 12 is applied as one input of a phase and frequency detector 14, illustrated in greater detail in FIG. 2. The phase and frequency detector 14 also receives an external Read Gate signal, the output of divider oscillator 12, the Raw Read Data from the external storage device, and the output of a voltage-controlled oscillator programmable divider 16. As described in greater detail below, in the presence of data, that is, when the Read Gate signal is active, the data separator functions in a lock-to-data mode in which the phase and frequency detector 14 compares the output frequency of oscillator programmable divider 16 to the incoming data, and produces a pump-up signal $\overline{UP}$ that is proportional to the magnitude of the phase difference between a data pulse and the start of the next clock cycle, and a pump-down signal DN. In the absence of data, the separator operates in a lock-to-clock mode, in which the Read Gate signal is inactive and in which the detector 14 acts to phase lock the clock derived from oscillator divider 12 with the internal clock derived from programmable divider 16.

To this end, the output frequency of programmable divider 16 is compared in detector 14 to the output of oscillator divider 12. The pump-down DN and pump-up $\overline{UP}$ signals produced in detector 14 as a result of that comparison are applied to the inputs of a charge pump 18, illustrated in greater detail below and in FIG. 4. The charge pump 18 produces a net charge or current per unit time. The output of charge pump 18 is passed through a loop filter 22 that includes a network of resistors and capacitors. The applied charge from charge pump 18 is stored on the capacitors in filter 22 for a period of time so as to average the charge over time and thereby produce a smoothed output voltage that is proportional to the averaged charge. The voltage output of filter 22 is applied as a control voltage to a voltage-controlled oscillator (VCO) 20, which produces a raw VCO clock out signal at its output at a frequency that is proportional to that voltage and thus to the net charge derived from the charge pump 18.

The output of VCO 20 is applied as one input of programmable divider 16, which also receives the programming fraction N and a reset signal from a zero phase start up circuit 24. Programmable divider 16 divides the output of VCO 20 by the factor N in order to provide the phase comparator in detector 14 with a VCO signal at the proper frequency for a given data rate, which is typically, for MFM encoding, at 250 kHz, 300 kHz, 500 kHz, or 1 MHz.

Figure 7A:
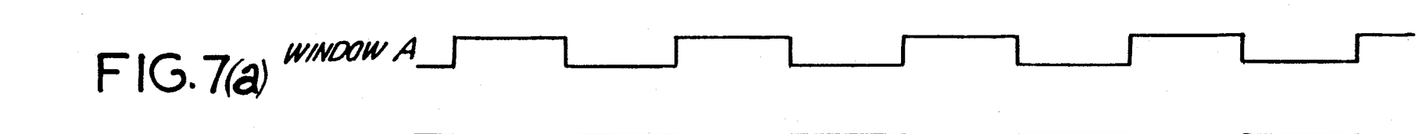
Figure 7B:
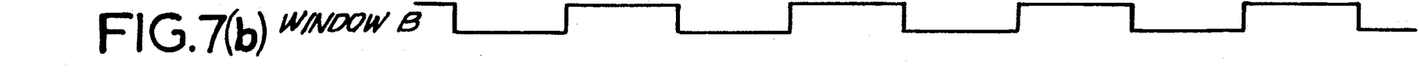
Figure 7C:
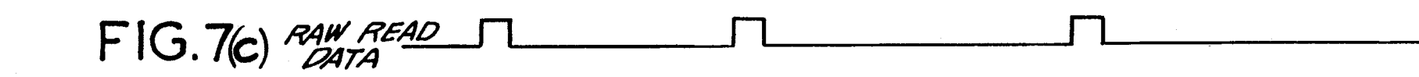

The zero phase start 24 receives the Read Gate signal and the Raw Read data (FIG. 7(c)) and produces a reset signal to the programmable divider 16 to reset a counter in divider 16 at the first data pulse received after the Read Gate signal goes high, that is, when the read data mode is established. This permits more rapid synchronization of data and clock by reducing the initial phase error between the data and clock output of programmable divider 16

Figure 5:
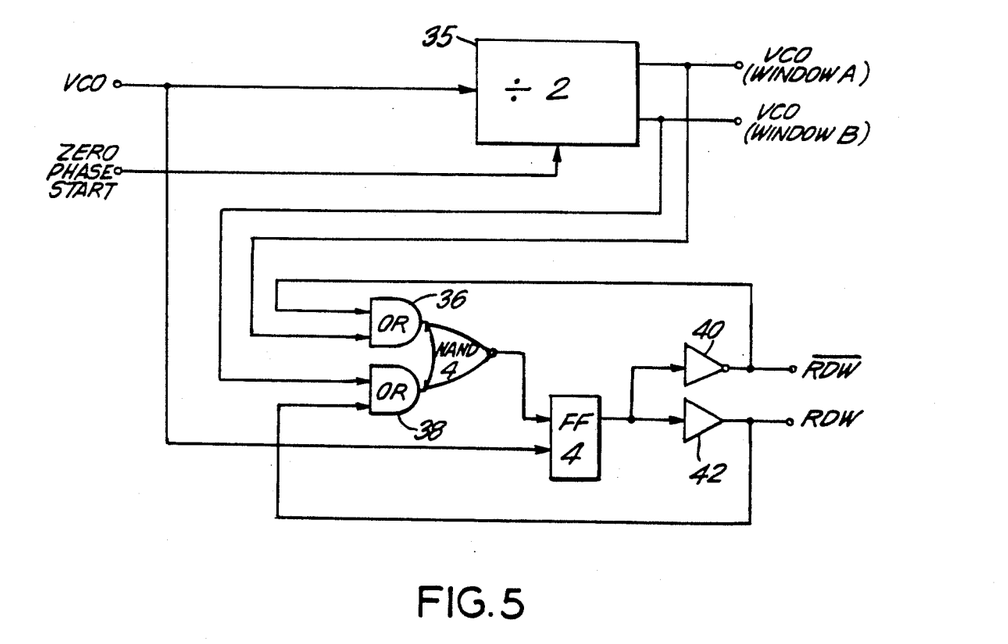
FIGS. 5 and 6 constitute a schematic diagram of the window and data generator of the data separator of FIG. 1.
Figure 6:
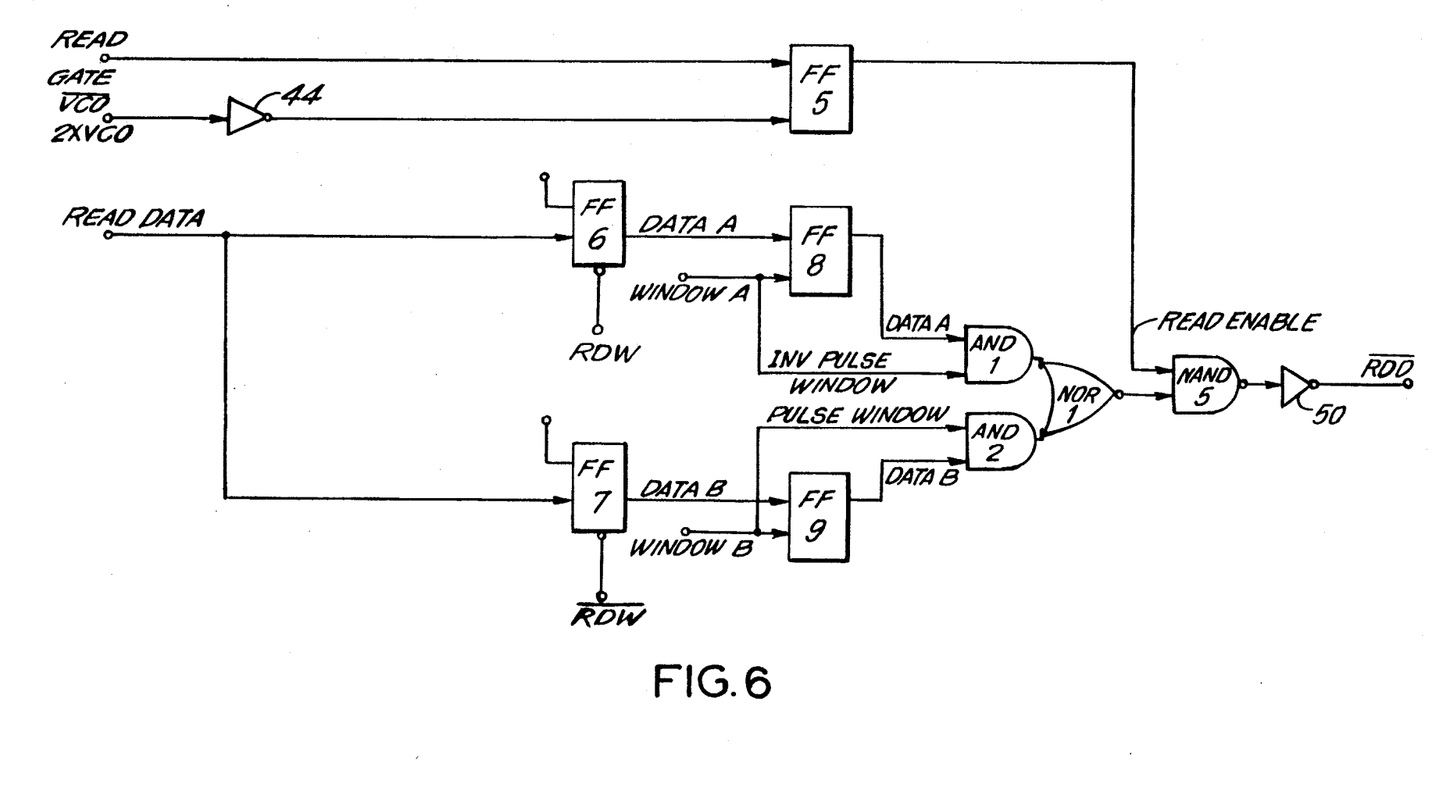

The output of programmable divider 16 is applied to one input of detector 14 and to a window and data generator 26 illustrated in greater detail in FIGS. 5 and 6. Window and data generator 26 also receives a reset signal from zero phase start 24, the raw oscillator output OSC out from programmable divider 12, the Raw Read Data and the Read Gate signal. As described in greater detail below, window and data generator 26 produces a properly timed and positioned Read Data signal RDD (FIG. 7(g)) and a Read Data window RDW (FIGS. 7(h) and (i)).

Before data is received from a floppy disk, that is, when the data separator of the invention is in a non-read mode, the Read Gate signal is low. The phase and frequency detector 14 in this mode compares the phase of the output OSC OUT of oscillator divider 12 with the output VCO OUT of the programmable divider 16, to create phase alignment or lock between these two signals. When the Read Gate signal becomes high and an encoded data pulse is received, the data separator enters the data mode, in which the data pulses are centered with respect to the positive edges of the internal clock pulse.

When an encoded data pulse is received by the data separator, the pump-up signal $\overline{UP}$ is activated at detector 14 and is high or active for a period determined by the deviation of the data pulse from the next positive edge of the VCO OUT signal (FIG. 3), This causes a current 21 to flow out of the charge pump 18 for the duration of the pump-up signal. Thereafter, the pump-up signal $\overline{UP}$ goes inactive and the pump-down signal DN is activated (FIG. 3). A current I flows out of the charge pump 18 for the duration of the pump-down signal. On the next positive edge of the VCO OUT signal, the pump-down signal DN is turned off. This causes the positive edges of the VCO OUT signal to center themselves around the average position of the encoded data pulses.

When the data pulse occurs in the center of a VCO clock cycle, the pump-up signal is one-half the period of one clock cycle. The amount of charge added to the charge pump 18 is:

$$2 \times I \times T_p/2 = I \times T_p$$

On the next VCO cycle, the pump-up signal $\overline{UP}$ is turned off and the pump down signal DN will be turned on for one clock cycle. The amount of charge added to the charge pump will be $$-I \times T_p$$

This negative charge cancels the charge added during the previous half VCO cycle.

If the received encoded data pulse occurs before the center of the VCO clock cycle, the duration of the pump-up signal $\overline{UP}$ is increased. There is then a positive net gain in the charge produced by to the charge pump 18 and the frequency of VCO 20 will increase. If the received encoded data pulse occurs after the center of the VCO clock cycle, the duration of the pump-up signal UP is decreased There is then a negative net gain in the charge from the charge pump 18 and the VCO frequency will decrease.

Description of the Phase Detector

As illustrated in FIG. 2, the frequency and phase detector 14 includes a multiplexer MUXl, which receives the OSC OUT and Raw Read Data signals at its two inputs and the Read Gate signal at its select input. The output of multiplexer MUXl is applied to an input of a flip-flop FFl, which receives a clear or reset signal from the output of a multiplexer MUX2. The true output of flip-flop FFl is applied to one input of a multiplexer MUX3 and its complement is applied to the other input of multiplexer MUX3, to the input of a NAND gate NANDl, and to the input of buffer-amplifier Al, the output of which is the inverse of the pump-up signal $\overline{UP}$.

The output of multiplexer MUX3, which receives the Read Gate signal at its select input, is applied to one input of a NAND gate NAND2, the other input of which is obtained from the output of a flip-flop FF2. The reset terminal of flip-flop FF2 is connected to the output of NAND gate NAND2 as is one of the inputs to multiplexer MUX2. The VCO OUT signal from VCO programmable divider 16 is applied to an input of flip-flop FF2.

Multiplexer MUX2 receives the Read Gate signal at its select terminal and the output of NAND gate NAND3 at its other input. The other input to NAND gate NAND2 is obtained from the output of flip-flop FF2. The output of flip-flop FF2 is also applied as an input to a flip-flop FF3 and to one input of a multiplexer MUX4. The other input to flip-flop FF3 is the output of gate NANDl, and its output is applied to the other input of multiplexer MUX4. The select terminal of multiplexer MUX4 receives the Read Gate signal. The output of multiplexer MUX4 is applied to an input of buffer-amplifier A2, the output of which is the pump-down signal DN.

During the lock-to-clock mode, the Read Gate signal is low so that multiplexer MUXl passes the OSC OUT signal to flip-flop FFl, which thus goes high on the positive-going edge of the OSC OUT signal The inverse of that signal is passed directly to buffer-amplifier Al whose output is the inverse pump-up signal $\overline{UP}$. The positive edge of the VCO out signal sets the output of flip-flop FF2 high. That high signal passes to gate NAND2 to reset the flip-flop The output of flip-flop FF2 is also passed through multiplexer MUX2 to reset flip-flop FFl. The true output of flip-flop FFl is passed through multiplexer MUX3 to the other input of gate NAND2.

In the lock-to-clock mode, when the Read Gate signal is low, the differentiation in the duration of the pump-up signal $\overline{UP}$ and the pump-down signal DN is proportional to the phase and frequency difference between the OSC and VCO clocks. The relative durations of the pump-up and pump-down signals $\overline{UP}$ and DN add or subtract charge from the charge pump 18 so as to vary the frequency of VCO OUT by varying the control voltage applied to VCO 20, until the positive edges of the OSC and VCO clocks are phase aligned. At this time the duration of the pump-up and pump-down signals, established as described in phase and frequency detector 14, are at values at which the frequency of VCO 20 remains unchanged.

When the Read Gate signal becomes high, the circuit enters the lock to data mode. In this mode, multiplexer MUXl passes the Raw Read Data signal to flip-flop FFl, which thus goes high on the positive-going edge of the Raw Read Data Signal. The inverse of that signal is passed directly to buffer-amplifier Al to produce the pump-up signal $\overline{UP}$. As in the prior mode, the VCO OUT signal sets flip-flop FF2 high. That high signal is passed through gate NAND2 to reset flip-flop FF2 and through gate NAND3 and multiplexer MUX2 to reset flip-flop FFl.

The low output of flip-flop FFl is applied through gate NANDl to the input of flip-flop FF3. The high going output of flip-flop FF2 samples the input of flip-flop FF3 and is passed through multiplexer MUX4 and to the buffer-amplifier A2 to produce the pump-down signal DN. In this manner, the presence of a data pulse causes the output of flip-flop FFl to go high. This causes the pump-up signal $\overline{UP}$ to go high. The pump-up signal $\overline{UP}$ will remain high until the next positive going edge of the VCO OUT signal.

When the output of flip-flop FFl is high, the next positive edge of the VCO OUT signal will cause flip-flop FF2 to go high and this causes flip-flop FF3 to sample this input and the output of flip-flop FF3 to go high, thereby causing the buffer-amplifier A2 to produce the pump-down signal DN, which, in turn, causes DN to go high. The resetting of flip-flop FFl causes the pump-up signal $\overline{UP}$ to go inactive. The phase difference between the raw data and the VCO clock thus establishes the relative duration of the pump-up and pump-down signals so as to establish a control voltage VCO at which the data is properly aligned with respect to the VCO clock.

Figure 3A:
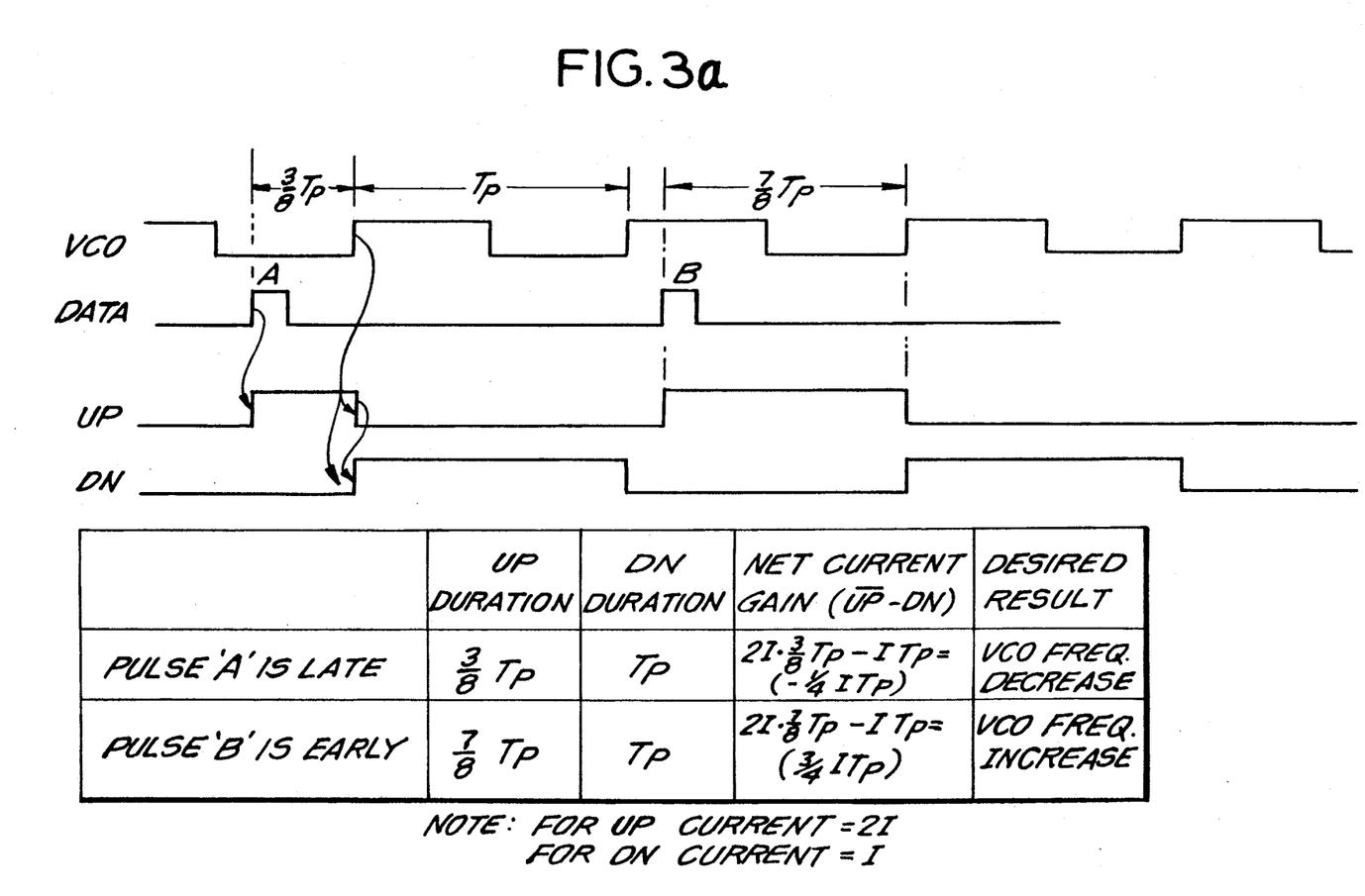
FIGS. 3a and 3b are wave form diagrams explaining the derivation of the pump-up and pump-down signals in the phase detector of FIG. 2 for the lock-to-data and lock-to-clock modes of operation of the data separator circuit respectively.

An example of the operation of the data lock mode, i.e., when the Read Gate signal is high, is illustrated in FIG. 3a for a data pulse A whose leading edge is $\frac{3}{8}$ Tp from the next positive-going VCO clock pulse, Tp being the duration of a clock cycle or a clock window, and data pulse B, which occurs $\frac{1}{8}$ Tp before the next positive-going VCO clock.

For data pulse A, the duration of the pump-up signal UP is $\frac{3}{8}$ Tp, whereas that for data pulse B is $\frac{1}{8}$ Tp. For each case, as for any data pulse, the duration of the pump-down signal DN is Tp, one clock cycle width, since its duration is controlled solely by the VCO clock. As described below, when the pump-up signal UP is high, the charge pump 18 produces a current of 2I, whereas when the pump-down signal is high, the charge pump 18 produces a current in the opposite direction of half that value or $-I$.

Thus, in the example illustrated in FIG. 3a, the net current gain (or loss) for data pulse A is $2I \times 3Tp/8 - ITp = -\frac{1}{4}ITp$, which produces a decrease in the frequency of VCO. Similarly, for the example of data pulse B, the net current gain (or loss) produced by charge pump 18 is $2I \times \frac{7}{8}Tp - ITp = \frac{3}{4}ITp$, which produces an increase in the frequency of the VCO clock. This process of correction through a variation of the frequency of the VCO clock continues until the data pulse is centered between the positive-going edge of the VCO clock, at which time the data pulse is centered in the clock window.

It will be appreciated that the pump-up signal $\overline{UP}$ is turned on high for a period that is proportional to the period between the data pulse and the remainder of the VCO clock window, whereas the pump-down signal DN is turned on and then off for complete clock window. At phase lock, when the data pulse is centered between the positive edges of the VCO clock, the duration of the pump-up signal will be $\frac{1}{2}$ a clock window and thus $\frac{1}{2}$ that of a pump-down signal. Since at phase lock the net charge to VCO 20 is zero, the current supplied during the pump-up period of signal $\overline{UP}$ is twice that of the current supplied during the period of the pump-down signal DN. If, on the other hand, the data is not properly aligned with the VCO clock, the pump-up period is a function of the phase error between the data and VCO clock. To correct that error, the frequency of the VCO clock is changed, until the duration of the pump-up signal $\overline{UP}$ is equal to one-half the duration of the pump-down signal DN.

Figure 3B:
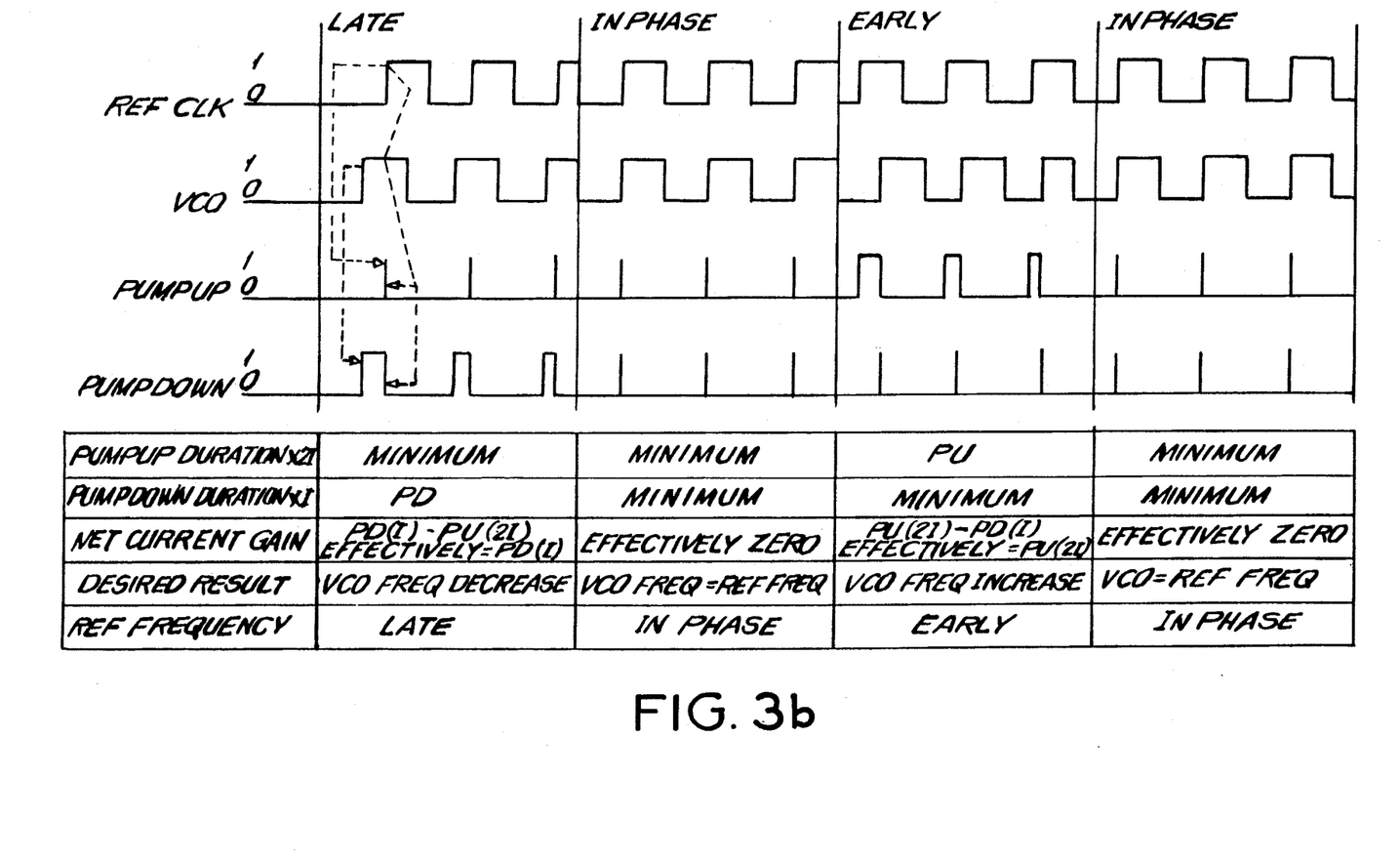

An example of the operation of the data separator of the invention in the lock-to-clock mode i.e., when the Read Gate signal is low, is illustrated in FIG. 3b, for two conditions, when the reference clock is late as compared to the VCO clock, and when the reference clock is early with respect to the VCO clock. It will be observed in FIG. 3b that the duration of the pump-down signal DN is proportional to the extent to which the reference clock lags behind the VCO clock to produce a net current, which is effectively the duration of the DN cycle times the current I of the current source. On the other hand, when the reference clock leads the VCO clock, the duration of the pump-up signal $\overline{UP}$ is proportional to the extent to which the reference clock leads the VCO clock so that the net current gain is effectively the pump-up duration times 2I. In either case, the end result of this operation is to bring the reference clock in phase with VCO clock.

Figure 4:
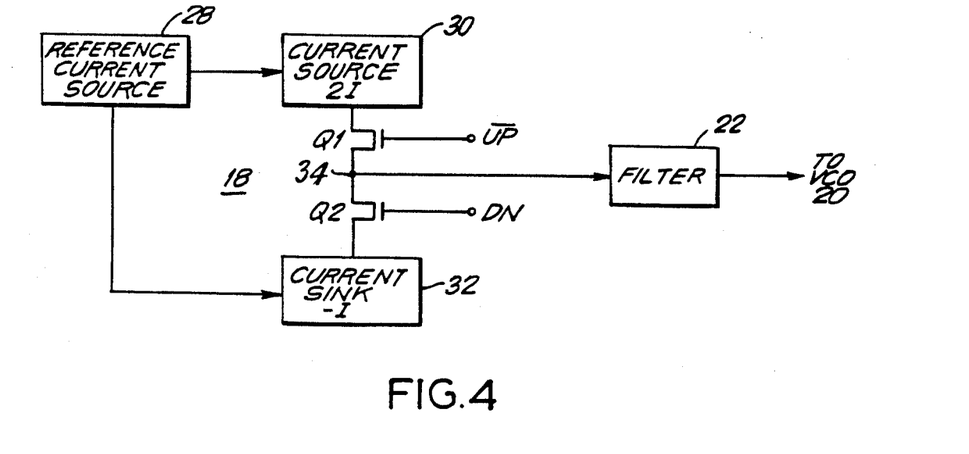
FIG. 4 is a schematic diagram of the charge pump of the data separator of FIG. 1.

The manner in which the charge pump 18 produces a current during the pump-up period that is twice the current that is produced during the pump-down period is now explained with reference to FIG. 4, which schematically illustrates the charge pump 18. As therein shown, the charge pump 18 includes a reference current source 28, which provides current to a current source 30 of a magnitude 2I and a current sink 32 which supplies a negative current of a magnitude −I. The outputs of current source 30 and current sink 32 are connected through the source-drain path of MOS FETS Q1 AND Q2, a node 34 being formed at their common connection The gate of FET Q1 receives the pump-up signal $\overline{UP}$ whereas the gate of FET Q2 receives the pump-down signal DN. Node 34 is connected through the filter 22 to the control input of VCO 20.

When the pump-up signal $\overline{UP}$ is active, FET Q1 is turned on to pass the current 2I from current source 30 to the VCO 20 through the filter 22. On the other hand, when the pump-down signal DN is active, FET Q2 is turned on to connect the −I current sink to the VCO through filter 22.

The window and gate generator 26 produces a reconstructed clock (RDW) and data pulses (RDD). As illustrated in FIG. 5, the VCO signal at twice the data rate is applied to a divide-by-two circuit 35, which also receives the zero phase start signal The outputs of circuit 35 are the window A (FIG. 7(a)) and its complement window B (FIG. 7(b)). The window A and B signals are applied as two inputs to a logic circuit consisting of two OR gates 36 and 38 whose outputs are applied to the inputs of a NAND gate NAND4. The output of gate NAND4 is applied to an input of a flip-flop FF4, which receives the VCO clock as its clock input The output of flip-flop FF4 is applied to an invertor 40 to produce the $\overline{RDW}$ signal (FIG. 7(i)) and to a buffer 42 to produce the RDW signal (FIG. 7(h)). These signals are also fed back respectively to the inputs of OR gates 36 and 38.

As shown in FIG. 6, the Read Gate signal and the VCO clock inverted in an inverter 44 are applied to the input and clock terminals of a flip-flop FF5, the output of which, the Read Enable signal, is applied to one input of a NAND gate NAND5. The Read Data (FIG. 7(c)) signal is applied to the clock input terminal of flip-flops FF6 and FF7. The $\overline{RDW}$ signal is applied to the clear of flip-flop FF6 and the $\overline{RDW}$ signal is applied to the clear of flip-flop FF7.

Figure 7D:
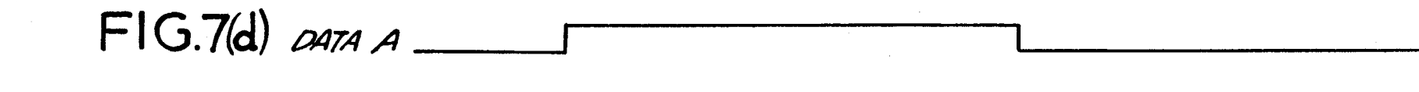
Figure 7E:
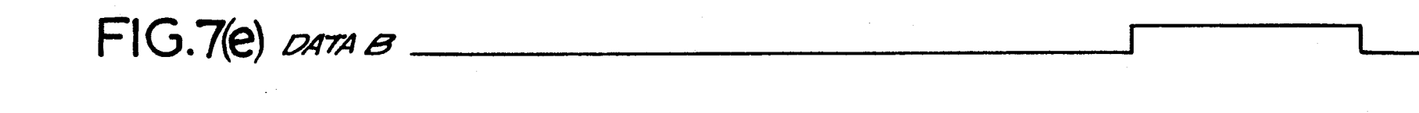
Figure 7F:
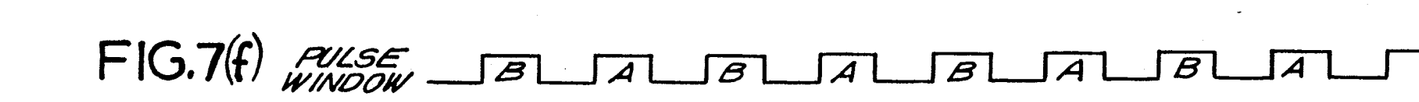
Figure 7G:
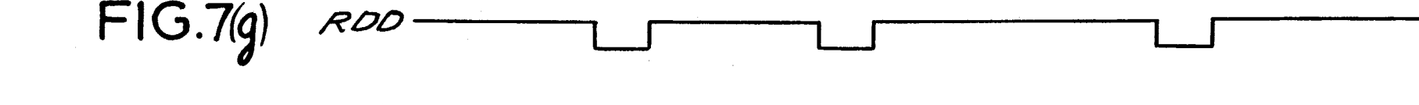
Figure 7H:
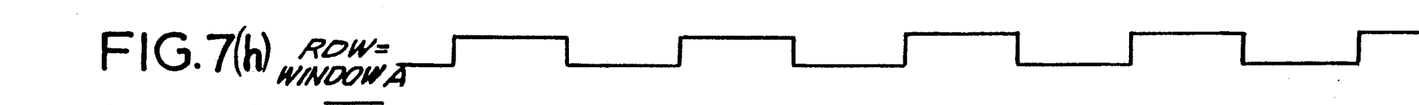
Figure 7I:
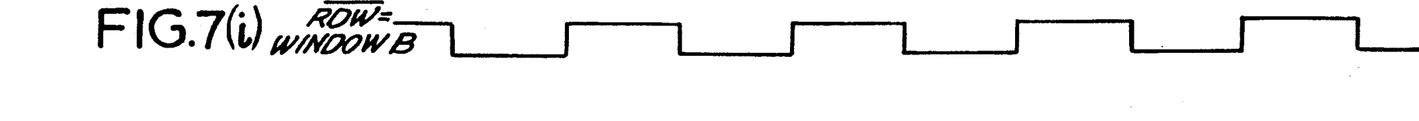

The outputs of flip-flops FF6 and FF7 are respectively the data A and data B signals (FIG. 7(d) and (e)), which are respectively applied to flip-flops FF8 and FF9. The latter also respectively receive the window A and window B signals at their clock terminals. The outputs of flip-flops FF8 and FF9 along with the window A and B signals are applied to a logic circuit consisting of AND gates AND1 and AND2 whose outputs are applied to the inputs of a NOR gate NOR1. The output of the latter is applied to the other input of NAND gate NAND5, whose own output after inversion in an invertor 50 is the $\overline{RDD}$ data signal (FIG. 7(g)), which, as defined, is centered within the clock window RDW (FIG. 7h)).

It will thus be appreciated that the data separator of the invention achieves its intended purpose of accurately synchronizing data received from an external data source with a clock without the use of a delay line. It will also be appreciated that modifications may be made in the single embodiment of the invention described hereinabove without necessarily departing from the spirit and scope of the invention.

We claim:

1. A data separator comprising means for detecting a phase difference between an input data pulse and a clock, a variable frequency clock source, means responsive to the detected phase difference for producing a control signal to said variable frequency clock source to vary the clock frequency in a manner so as to reduce said phase difference, said control signal producing means including means for producing one of a charge pump-up signal and a charge pump-down signal, at least one of said pump-up and pump-down signals having a duration that is representative of the detected phase difference between the input data and clock, said control signal producing means further including means for producing a net charge that is proportional to the relative duration of said pump-up and pump-down signals, said control signal producing means further comprising a charge pump coupled to said detecting means and means for producing currents in opposite directions during said pump-up and pump-down signals, respectively, said charge pump including means for supplying current at one magnitude during the duration of a pump-up signal and at a second, lesser magnitude during the duration of a pump-down signal.

2. The data separator of claim 1, in which said control signal producing means further comprises means coupled to said charge pump signal producing means and to said variable frequency clock source for converting said net charge to said control signal.

3. The data separator of claim 1, in which said charge pump comprises an output, a current source of a first current value, a current drain of a second, different current value, and switching means respectively responsive to said pump-up and pump-down signals alternately connect one of said current source and said current drain to said output.

4. The data separator of claim 1, further comprising means for operating the data separator in a lock-to-clock mode in the absence of a data signal and in a lock-to-data mode in the presence of a data signal.

5. The data separator of claim 1, in which the current produced by said charge pump during a pump-up signal is twice the current produced during a pump-down signal.

* * * * *

UNITED STATES PATENT AND TRADEMARK OFFICE
CERTIFICATE OF CORRECTION

PATENT NO. : 5,170,297

DATED : December 8, 1992

INVENTOR(S) : Richard Wahler, et al.

It is certified that error appears in the above-indentified patent and that said Letters Patent is hereby corrected as shown below:

Column 2, line 66 "is" should read "in".
Column 4, line 32, after "FIG.3)" there should be a period, instead of a comma
Column 4, line 66, after "decreased" there should be a period.
Column 5, lines 4 and 7, "MUXI" should read "MUX1"
Column 5, lines 8 and 10, "FFI" should read "FF1"
Column 5, line 13, "NANDI" should read "NAND1"
Column 5, line 13, "AI" should read "A1"
Column 5, line 19, after "FF2" there should be a period.
Column 5, line 39, "MUXI" should read "MUX1"
Column 5, line 41, after "signal" there should be a period.
Column 5, line 42, "AI" should read "A1".
Column 5, line 46, after "flip-flop" there should be a period.
Column 5, line 48, "FFI" should read "FF1".
Column 5, line 67, "MUXI" should read "MUX1"
Column 5, line 68, "FFI" should read "FF1"
Column 6, line 2, "AI" should read "A1".
Column 6, line 7, "FFI" should read "FF1"
Column 6, line 9, "NANDI" should read "NAND1"
Column 6, Line 14, "FFI" should read "FF1"
Column 6, Line 18, "FFI" should read "FF1"
Column 6, Line 24, "FFI" should read "FF1"
Column 6, Lne 44, "21" should read "2I"
column 7, Line 36, "21" should read "2I"
Column 7, Line 41, after "conection" there should be a period.
Column 7, Line 46, "21" should read "2I"
Column 7, Line 55, after "signal" there should be a period.
Column 7, Line 63, after "input" there sould be a period.

UNITED STATES PATENT AND TRADEMARK OFFICE
CERTIFICATE OF CORRECTION

PATENT NO. : 5,170,297
DATED : December 8, 1992
INVENTOR(S) : Richard Wahler, et al.

It is certified that error appears in the above-identified patent and that said Letters Patent is hereby corrected as shown below:

Column 8, Line 2, there should not be a bar over "RDW"

Signed and Sealed this

Twenty-seventh Day of October, 1998

Attest:

BRUCE LEHMAN

Attesting Officer

Commissioner of Patents and Trademarks